(12) United States Patent
Morrison

(10) Patent No.: US 8,312,331 B2
(45) Date of Patent: Nov. 13, 2012

(54) MEMORY TESTING WITH SNOOP CAPABILITIES IN A DATA PROCESSING SYSTEM

(75) Inventor: Gary R. Morrison, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 849 days.

(21) Appl. No.: 12/425,101

(22) Filed: Apr. 16, 2009

(65) Prior Publication Data

US 2010/0268999 A1    Oct. 21, 2010

(51) Int. Cl.
    *G11C 29/00* (2006.01)
(52) U.S. Cl. ........................................ 714/719
(58) Field of Classification Search .................. None
    See application file for complete search history.

(56) References Cited

U.S. PATENT DOCUMENTS

| | | | |
|---|---|---|---|
| 5,671,231 A * | 9/1997 | Cooper ........................ | 714/724 |
| 5,838,694 A * | 11/1998 | Illes et al. ...................... | 714/738 |
| 5,925,145 A * | 7/1999 | Illes et al. ...................... | 714/738 |
| 7,444,568 B2 | 10/2008 | Morrison et al. | |
| 2003/0009715 A1 * | 1/2003 | Ricchetti et al. .............. | 714/727 |
| 2006/0026482 A1 | 2/2006 | Fujisaki | |
| 2006/0179369 A1 | 8/2006 | Bravo et al. | |
| 2008/0010567 A1 | 1/2008 | Hughes | |
| 2008/0235540 A1 | 9/2008 | Kobayashi | |
| 2008/0307276 A1 * | 12/2008 | Bodrozic et al. .............. | 714/719 |

OTHER PUBLICATIONS

Singh, A. et al.; "A Software Based Online Memory Test for Highly Available Systems"; 11th IEEE International On-Line Testing Symposium; Jul. 6-8, 2005; pp. 199-200; IEE.
Liu, J. et al; "A RAM Architecture for Concurrent Access and On-Chip Testing"; IEEE Transactions on Computers; Oct. 1991; pp. 1153-1159; vol. 40, No. 10 IEEE.
PCT Application No. PCT/US2010/028311; Search Report and Written Opinion dated Oct. 29, 2010.

* cited by examiner

*Primary Examiner* — John Trimmings
*Assistant Examiner* — Daniel McMahon
(74) *Attorney, Agent, or Firm* — Joanna G. Chiu

(57) ABSTRACT

A method of testing a memory includes generating a plurality of addresses, such as a test address, accessing contents of each of the plurality of addresses and storing them in storage circuitry, performing a test on the plurality of addresses, accessing the memory test circuitry by sending an access address to snooping circuitry, determining if the access address matches at least one of the plurality of addresses and generating at least one hit indicator in response thereto, generating a snoop miss indicator, determining if the snoop miss indicator indicates a miss, if the snoop miss indicator indicates a miss, accessing the memory in response to the access address, and if the snoop miss indicator does not indicate a miss, either storing snooped data from a interconnect master to a selected portion of the storage circuitry or reading the snooped data from the selected portion of the storage circuitry to the interconnect master.

17 Claims, 6 Drawing Sheets

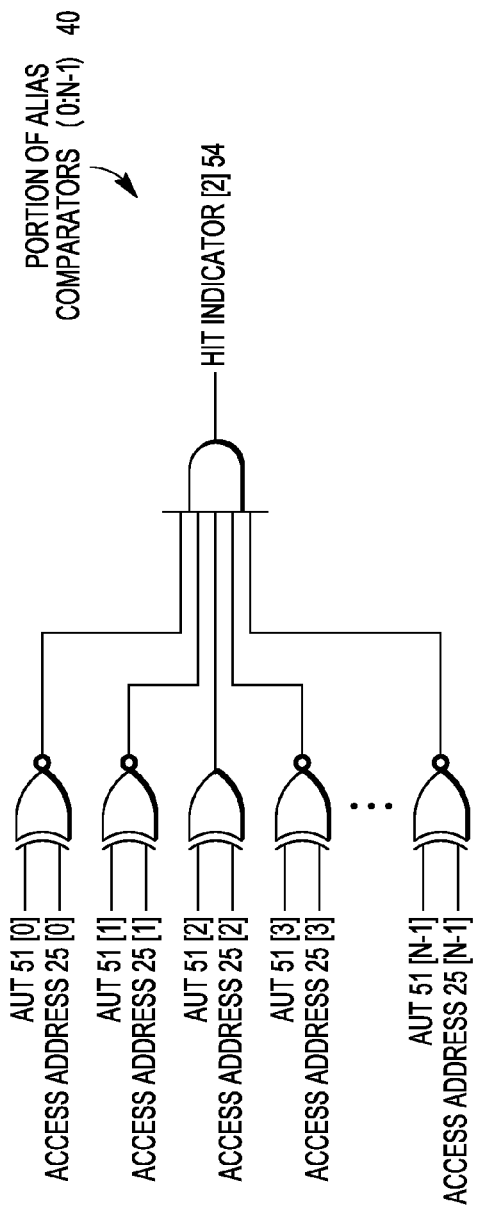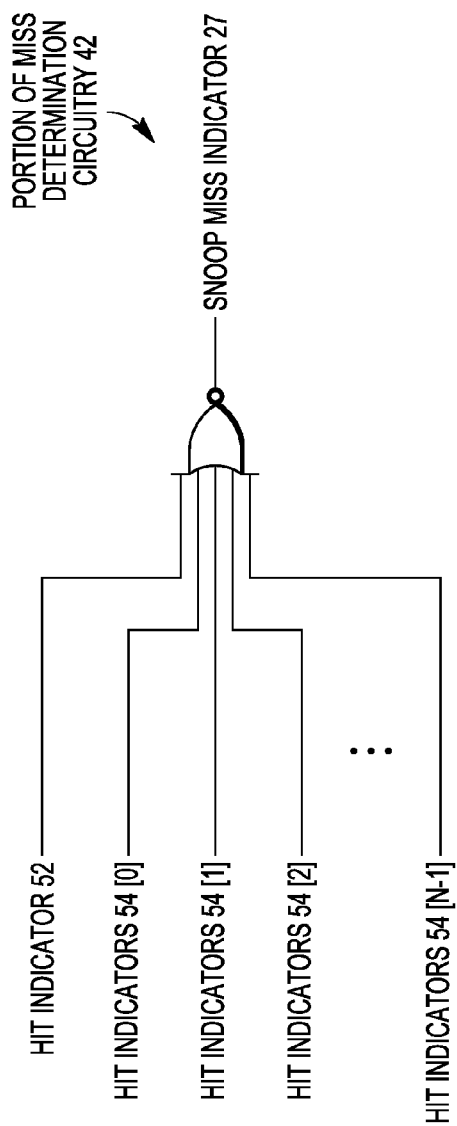
FIG. 5
FIG. 6

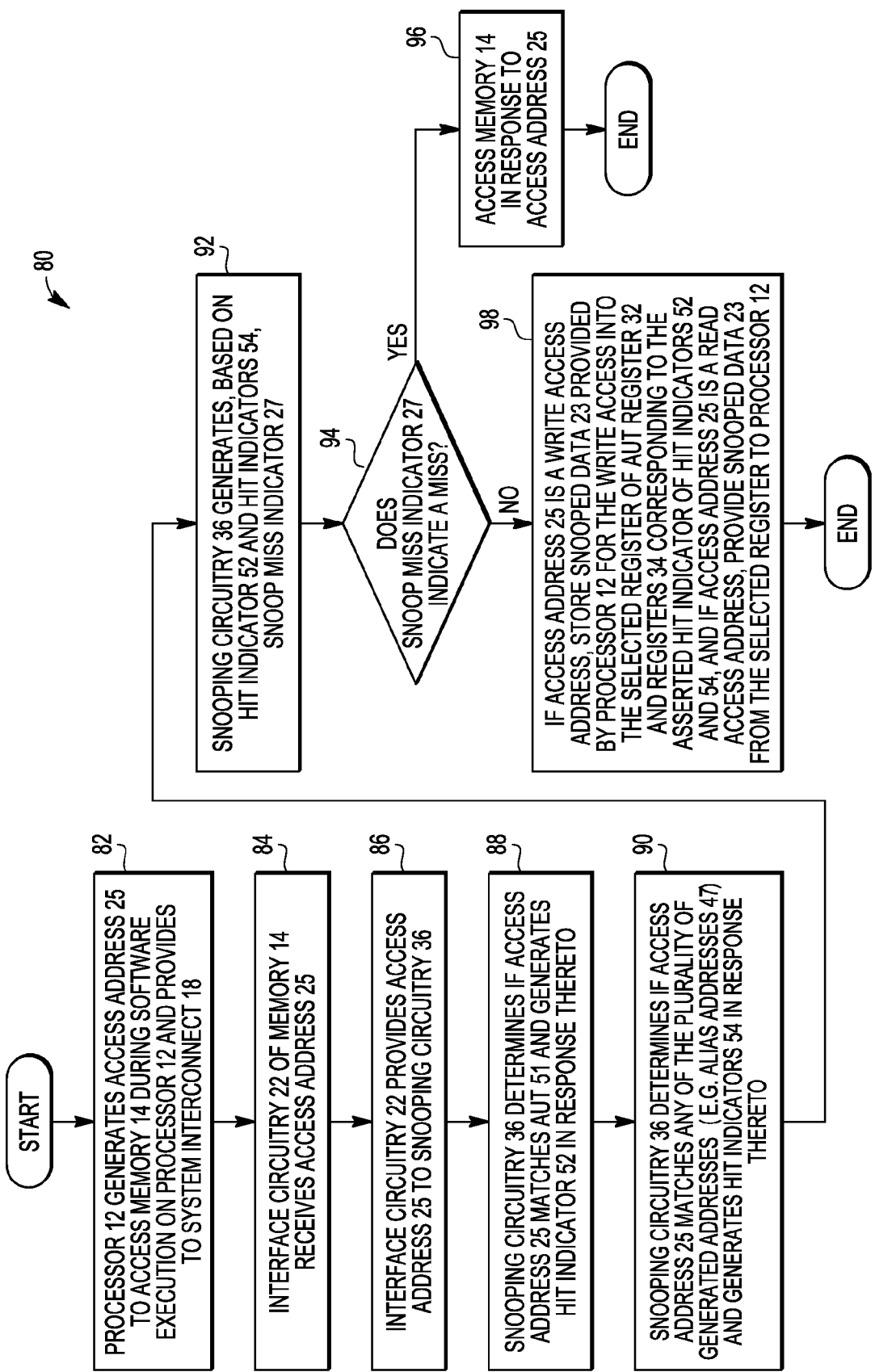

MEMORY TESTING WITH SNOOP CAPABILITIES IN A DATA PROCESSING SYSTEM

BACKGROUND

1. Field

This disclosure relates generally to data processing systems, and more specifically, to memory testing with snoop capabilities.

2. Related Art

Memory testing is important to ensure proper operation. In many data processing systems available today, test software is run to perform memory testing. However, this type of memory testing precludes the ability to run other software applications while the memory test is being performed. This limits the points in time at which memory testing can be performed. Memory testing also inherently requires altering memory content. To allow memory testing during normal system operation, its pre-test content must be restored or reconstructed after the test and prior to continuing operation. This can be very time-consuming, or often not realistically possible.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 4 and 5 illustrate, in schematic forms, portions of the alias comparators of FIG. 2, in accordance with one embodiment of the present invention.

FIG. 6 illustrates, in schematic form, a portion of the miss determination circuitry of FIG. 2, in accordance with one embodiment of the present invention.

FIG. 8 illustrates, a method for snooping an access address in accordance with one embodiment of the present invention.

DETAILED DESCRIPTION

Figure 1:
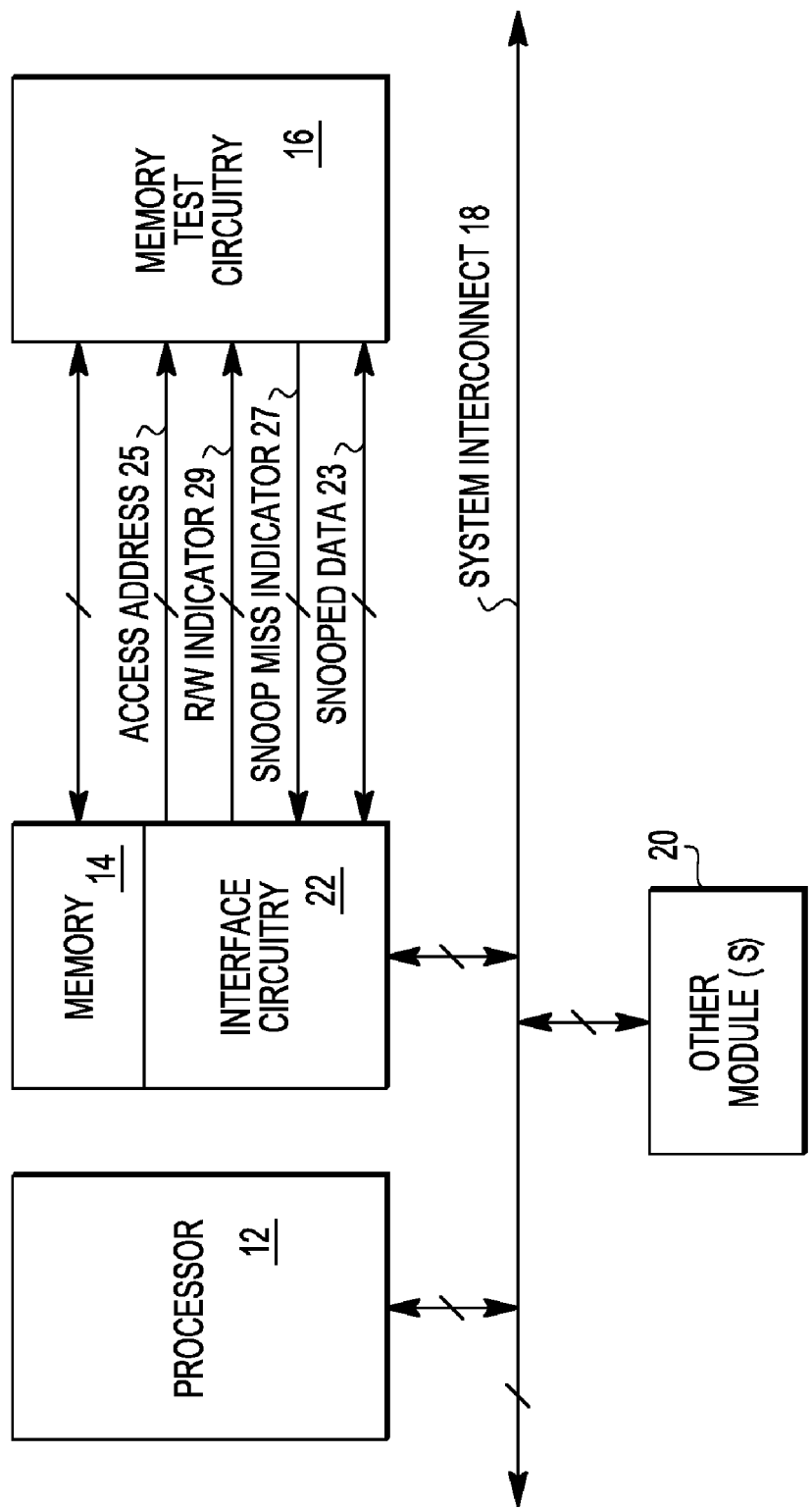
FIG. 1 illustrates, in block diagram form, a data processing system in accordance with one embodiment of the present invention.

Various embodiments described herein allow for memory testing to occur while data-processing activity on the data processing system which accesses the memory can continue to operate. Data-processing activity may include, but is not limited to, software running on a processor, or direct-memory-access-device operation, in the data processing system. In one embodiment, hardware memory built in self test (MBIST) is used to perform memory testing that is transparent to data-processing activity that requires access to the memory being tested. In one embodiment, when a particular portion of a memory is to be tested, that portion is first copied into registers or some other storage circuitry. During data-processing activity which accesses the memory, a snooping mechanism is used to determine when a memory access request from the data-processing activity in the data processing system corresponds to the portion of the memory currently being tested. In that case, the memory access can be responded to through the use of the registers rather than accessing the memory. However, if the memory access is determined to not correspond to the portion of the memory currently being tested, the memory access can be responded to by accessing the memory.

Furthermore, in one embodiment, when a particular address location of a memory is being tested, a failure mechanism may be where one or more other addresses will alias to that address and thus should also be tested together with that address. In one embodiment, the one or more address aliases are related to the address being tested by having a single bit of the address inverted in comparison to the address being tested (examples of which will be discussed in more detail below). Therefore, in one embodiment, the particular portion of memory selected to be stored into registers in the snooping mechanism may correspond to the address location in the memory being tested as well as those address which result from a single bit inversion in that address. In this manner, the amount of memory needed to be stored to registers for snooping purposes may be minimized. That is, by limiting the memory test to the most-probable address aliases, it may be possible to avoid blanket testing, which is typically only done out of the factory or at power up, and allow for improved memory testing during normal operation of the memory.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS

[7:0]" indicates the eight lower order bits of an address value. The symbol "$" preceding a number indicates that the number is represented in its hexadecimal or base sixteen form. The symbol "%" preceding a number indicates that the number is represented in its binary or base two form.

FIG. 1 illustrates, in block diagram form, a data processing system 10 in accordance with one embodiment of the present invention. System 10 includes a processor 12, a memory 14, memory test circuitry 16, other module(s) 20, and a system interconnect 18 Each of processor 12, memory 14, and other module(s) 20 (if any) are bi-directionally coupled to system interconnect 18. Memory 14 includes interface circuitry 22 and is bi-directionally coupled to memory test circuitry 16. Interface circuitry 22 of memory 14 provides a read/write (R/W) indicator 29 and an access address 25 to memory test circuitry 16. Memory test circuitry 16 provides a snoop miss indicator 27 to interface circuitry 22, and interface circuitry 22 bi-directionally communicates snooped data 23 with memory test circuitry 16. In one embodiment, processor 12 is any device capable of data-processing activity described above, such as a general purpose processor or a digital signal processor, and may be referred to as an interconnect master. Alternatively, processor 12 can instead be any other type of interconnect master, such as a direct memory access (DMA) controller, etc. Also, even though only one processor is shown, those skilled in the art will know that the described embodiments are also applicable to systems having multiple processors, where one or more of these multiple processors may be capable of accessing memory 14. Other module(s) 20 may include other interconnect masters, other memories, peripheral devices, input/output (I/O) devices, etc. Alternatively, other modules 20 may not be present. Also, even though only one memory is shown, those skilled in the art will know that additional memories may be present which may also be tested and snooped in a similar fashion as memory 14. Also, note that memory 14 can be any type of memory that can be read from and written to.

Note, there may be additional functional blocks coupled to system interconnect 18 that are not illustrated in FIG. 1. In one embodiment, system interconnect 18 may be characterized as a bus comprising a plurality of conductors coupled to each block of the system. In another embodiment, system interconnect 18 may be a conventional "cross-bar" type bus that allows simultaneous communications between system blocks. In another embodiment, system interconnect 18 may be an Advanced High-performance Bus (AHB). AHB is a bus protocol introduced in AMBA Specification version 2 published by ARM Ltd Company. In yet another embodiment, system interconnect 18 may be another type of system interconnection system.

In operation, processor 12 is capable of data processing activity (such as, for example, executing software) which accesses memory 14 for read accesses, write accesses, or both read and write accesses. Processor 12 operates as known in the art and will not be described in further detail herein. When processor 12 requires access (read or write access) to memory 14, processor 12 generates an access request and provides this access request via system interconnect 18 to memory 14. The access request includes an access address corresponding to an address location in memory 14 and a read/write (R/W) indicator to indicate whether the access request is a read access or a write access request. If the access request corresponds to a write access request, processor 12 also provides write data as part of the access request. This access request is received by interface circuitry 22 within memory 14. In response to the access request from processor 12, interface circuitry 22 can communicate with memory test circuitry 16 to determine whether the access request corresponds to an address location currently being tested by memory test circuitry 16 and respond accordingly. In one embodiment, interface circuitry 22 communicates the access address of the access request from processor 12 as access address 25 to memory test circuitry 16 and provides R/W indicator 29 corresponding to access address 25 to memory test circuitry 16. If access address 25 corresponds to an address location currently being tested, memory test circuitry 16 (rather than memory 14) can return read data (if R/W indicator 29 indicates a read access) as snooped data 23 to interface circuitry 22 or can receive write data (if R/W indicator 29 indicates a write access) as snooped data 23 from interface circuitry 22. Therefore, snooped data 23 can be provided to or from memory test circuitry 16 depending on whether access address 25 corresponds to a read access or a write access. In the case of a read access, interface circuitry 22 can then communicate snooped data 23 back to processor 12. If, on the other hand, access address 25 does not correspond to an address location currently being tested, memory 14 can respond to the access request from processor 12 and either receive the write data or provide the read data, as known in the art. Further details of the snooping aspect of memory test circuitry 16 will be described in reference to FIGS. 2-6 and 8 below.

Also, memory test circuitry 16 is bidirectionally coupled to memory 14 to perform memory testing on memory 14. Further details of this memory testing will be described in further detail in reference to FIGS. 2 and 7 below.

Figure 2:
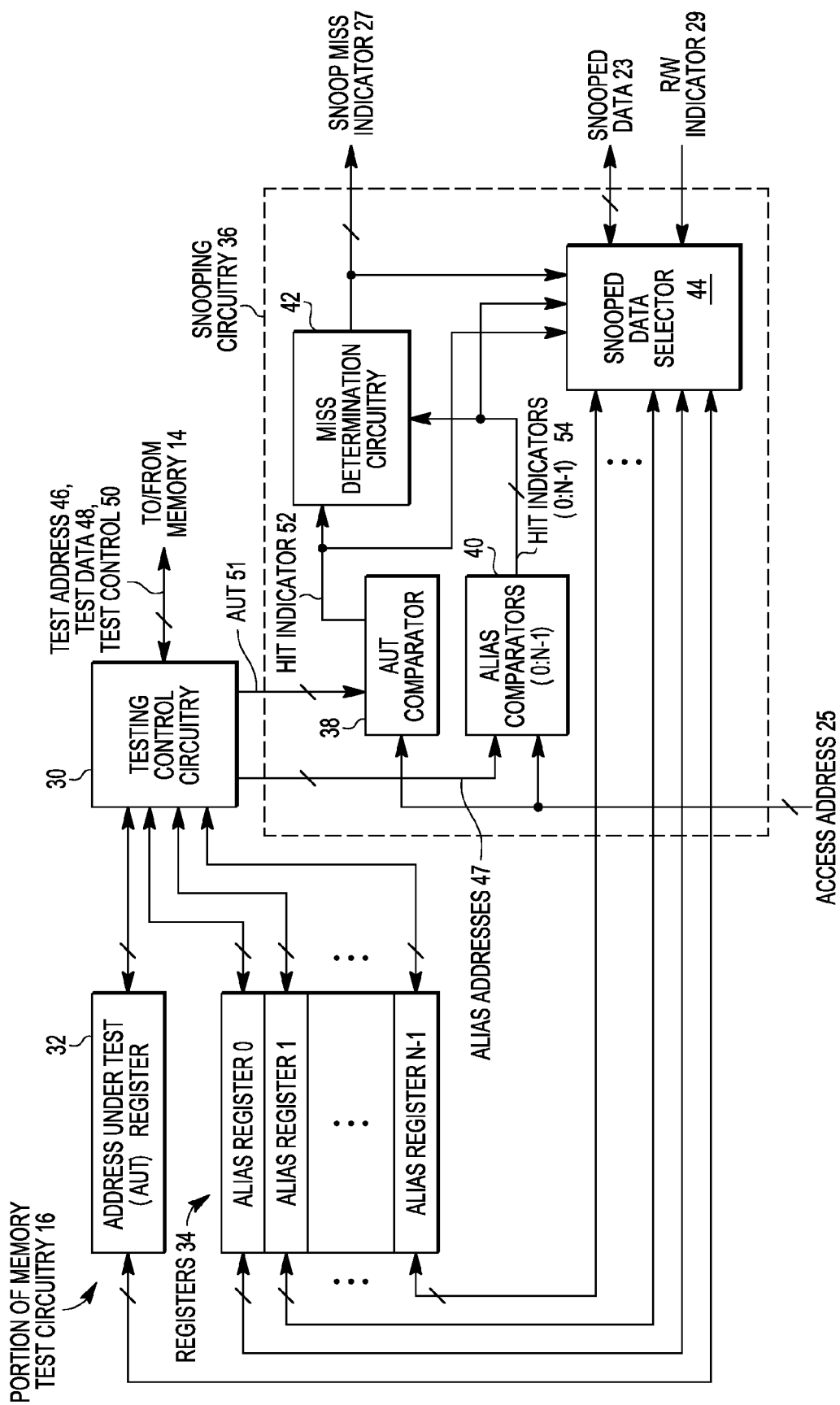
FIG. 2 illustrates, in block diagram form, a portion of the memory test circuitry of FIG. 1, in accordance with one embodiment of the present invention.

FIG. 2 illustrates, in block diagram form, a portion of memory test circuitry 16 in accordance with one embodiment of the present invention. FIG. 2 includes an address under test (AUT) register 32, one or more registers 34, testing control circuitry 30, and snooping circuitry 36. Testing control circuitry 30 is bidirectionally coupled to each of AUT register 32 and registers 34 and is also coupled to snooping circuitry 36. Snooping circuitry 36 is bidirectionally coupled to AUT register 32 and registers 34. In one embodiment, registers 34 includes N alias registers 0 through N−1, where N can be any integer greater than 0. Therefore, in one embodiment, registers 34 may be referred to as alias registers. Snooping circuitry 36 includes an AUT comparator 38, miss determination circuitry 42, alias comparators (0:N−1) 40, and a snooped data selector 44. AUT comparator 38 and alias comparators (0:N−1) 40 each receive access address 25. AUT comparator 38 also receives an address under test (AUT) 51 from testing control circuitry 30 and alias comparators (0:N−1) 40 also receives alias addresses 47 from testing control circuitry 30. In an alternate embodiment, alias comparators (0:N−1) 40 could instead receive AUT 51, from which to infer alias addresses 47 (where this inference is discussed below relative to FIGS. 4-5). AUT comparator 38 provides hit indicator 52 to miss determination circuitry 42 and snooped data selector 44, and alias comparators (0:N−1) 40 provide hit indicators (0:N−1) 54 to miss determination circuitry 42 and snooped data selector 44. Miss determination circuitry 42 provides snoop miss indicator 27 to interface circuitry 22 and to snooped data selector 44. Snooped data selector 44 also receives hit indicator 52 and hit indicators 54 and is also bidirectionally coupled to each of AUT register 32 and registers 34, and bidirectionally communicates snoop data 23. Snooped data selector 44 also receives R/W indicator 29. Testing control circuitry provides a test address 46 to memory 14. Testing control circuitry 30 also communicates test data 48 and test control 50 with memory 14.

In operation, testing control circuitry 30 uses AUT register 32 and registers 34 to test a portion of memory 14. Snooping circuitry 36 allows for data-processing activity executing elsewhere in system 10, such as in processor 12, to continue to access memory 14, even the portion being tested, while testing control circuitry 30 continues testing memory 14. Snooping circuitry 36 may also allow memory testing of memory 14 to continue while another interconnect master, such as a direct memory access (DMA) unit, is accessing memory 14. Therefore, in one embodiment, memory test circuitry 16 allows for the un-intrusive testing of memory 14 while minimally impacting access to memory 14 by other interconnect masters during normal operation.

Figure 7:
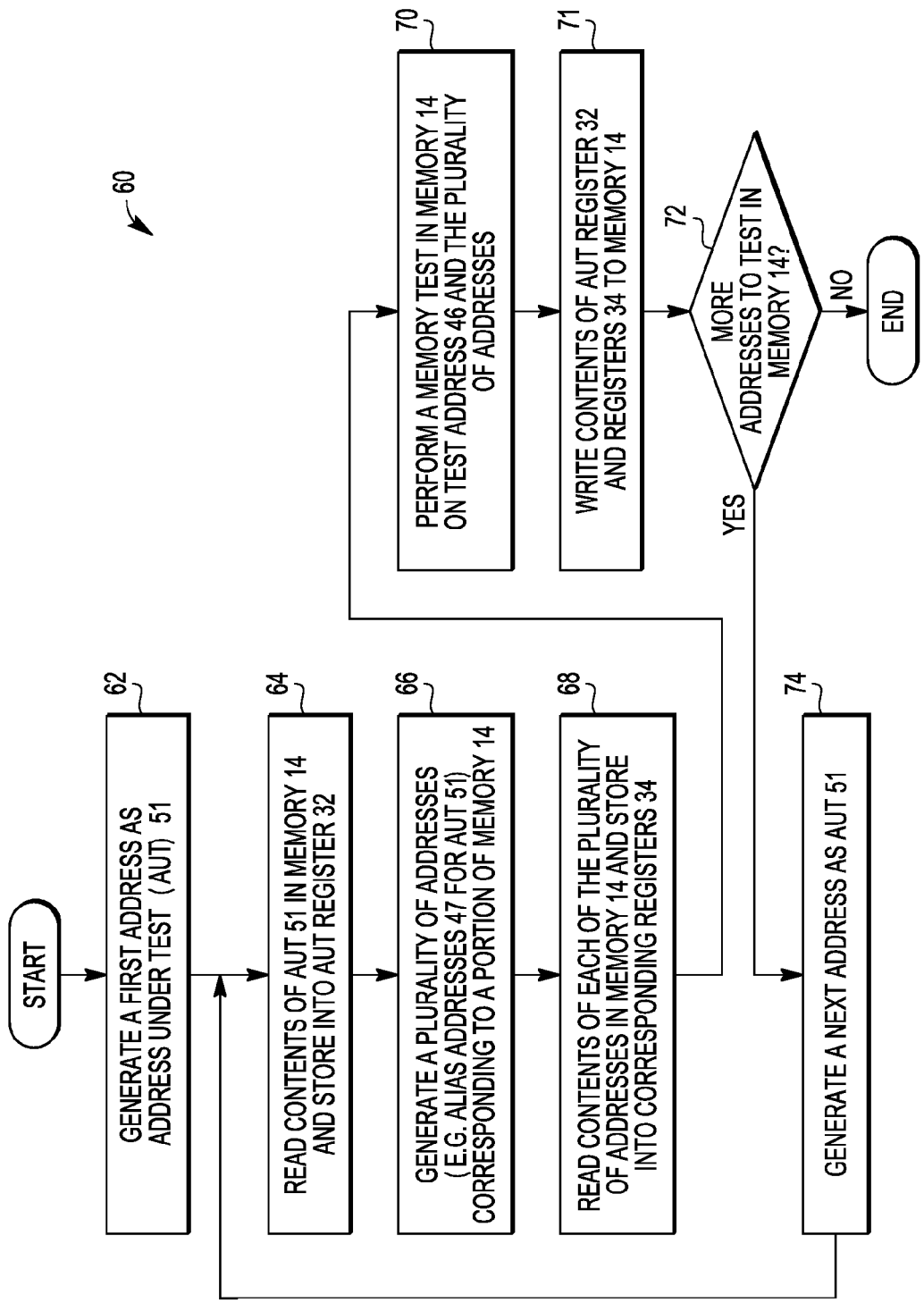
FIG. 7 illustrates, a method for testing a memory of FIG. 1 in accordance with one embodiment of the present invention.

First, operation of testing control circuitry 30 will be more specifically discussed in reference to the flow diagram of FIG. 7. FIG. 7 illustrates a flow 60 which describes a method for testing memory 14 in accordance with one embodiment. Referring to FIG. 7, flow 60 begins with block 62 in which a first address is generated as AUT 51. Therefore, in one embodiment, testing control circuitry 30 generates AUT 51 which corresponds to an address location in memory 14 that is to be tested. Testing control circuitry 30 also provides AUT 51 to snooping circuitry 36. Referring back to FIG. 7, flow then proceeds to block 64 where the contents of AUT 51 is read from memory 14 and stored into AUT register 32. Therefore, AUT register 32 now stores the contents of memory 14 located at AUT 51 and will preserve the original value of this location during testing of the location.

Flow then proceeds to block 66 where a plurality of addresses are generated corresponding to a portion of memory 14. This plurality of addresses can be generated by test control circuitry 30. In one embodiment, the plurality of addresses generated correspond to address aliases for AUT 51. That is, in one embodiment, each address of the plurality of addresses is related to AUT 51. For example, in one embodiment, each address of the plurality of addresses has one address bit inverted with respect to AUT 51. Therefore, if AUT 51 is an N-bit address, then each of N addresses can be generated having a different bit inverted with respect to AUT 51. In one embodiment, these alias addresses are used for the memory testing because if an address fails, it will typically fail due to one address bit. Therefore, by testing all those addresses which differ by only one bit from the address under test, a fairly complete testing of memory 14 can be accomplished. The plurality of generated addresses are also provided to alias comparators (0:N−1) 40 as alias addresses 47.

As an example, if AUT 51 is an 8-bit address such as % 00110001, then the plurality of alias addresses for this value of AUT 51 would include: % 00110000 (in which the last bit is inverted with respect to the last bit of AUT 51), % 00110011 (in which the second to last bit is inverted with respect to the second to last bit of AUT 51), % 00110101 (in which the third to last bit is inverted with respect to the third to last bit of AUT 51), % 00111001 (in which the fourth to last bit is inverted with respect to the fourth to last bit of AUT 51), % 00100001 (in which the fifth to last bit is inverted with respect to the fifth to last bit of AUT 51), % 00010001 (in which the sixth to last bit is inverted with respect to the sixth to last bit of AUT 51), % 01110001 (in which the seventh to last bit is inverted with respect to the seventh to last bit of AUT 51), and % 10110001 (in which the eighth to last bit is inverted with respect to the eighth to last bit of AUT 51). Therefore, note that each of the plurality of alias addresses differs from AUT 51 by only one bit.

Still referring to FIG. 7, flow proceeds from block 66 to block 68 wherein the contents of each of the plurality of addresses generated in block 66 are read from memory 14 and stored into a corresponding register of registers 34. Therefore, in the above example where AUT 51 is an 8-bit address, the contents of each of the eight alias addresses are read from memory 14 and stored into a corresponding register of registers 34. For example, for the AUT value of % 00110001, the contents of memory 14 at location % 00110000 may be stored in alias register 0, the contents of memory 14 at location % 00110011 may be stored in alias register 1, the contents of memory 14 at location % 00110101 may be stored in alias register 2, etc. In this example, registers 34 would include 8 alias registers: alias register 0 to alias register 7.

Still referring to FIG. 7, flow then proceeds to block 70 where a memory test is performed in memory 14 on AUT 51 and the plurality of generated addresses, such as the alias addresses. Testing control circuitry 30 may communicate test data 48, test control 50, and test address 46 as needed with memory 14 to perform the testing, where any testing as known in the art may be used to test these memory locations whose original contents prior to testing are stored in AUT register 32 and registers 34. For example, testing control circuitry 30 may cycle through each address of AUT 51 and alias addresses 47 to test these locations. Alternatively, other testing algorithms may be used. Flow then proceeds to block 71 where the contents of AUT register 32 and registers 34 are written back to memory 14 to their corresponding locations. Therefore, once testing is complete for the portion of memory 14 stored at AUT 51 and the plurality of generated addresses, testing control circuitry 30 can restore the original values in memory 14 which were stored in AUT register 32 and registers 34. Flow then proceeds to decision diamond 72 where it is determined whether there are more addresses to test in memory 14. If not, flow 60 ends. If so, flow 60 proceeds to block 74 where a next address is generated as AUT 51 and flow returns to block 64. Therefore, in one embodiment, testing control circuitry 30 generates a new value for AUT 51 and a new plurality of addresses corresponding to memory 14. Testing and restoration will then continue as described above.

Note that any portion of memory 14 can be tested by testing control circuitry 30. Testing control circuitry 30 may select any value for test address 46. Also, testing control circuitry 30 may select any addresses for the plurality of addresses where they need not be aliased addresses as described above. In this case, the plurality of addresses are still provided to comparators (0:N−1) 40 (as were alias addresses 47). Therefore, registers 32 and 34 can be used to hold any portion of memory 14 (corresponding to one or more address locations in memory 14) that is to be tested. For example, registers 32 and 34 can be used to store the contents of a particular range of memory where each address is simply sequential or a fixed distance away from a previous address. Alternatively, they could be related to time rather than address, such as most-recently accessed addresses, or related to statistics such as frequency of access or frequency of errors. Also, testing of memory 14 can occur at any time during normal operation of system 10. It can occur periodically or during idle times. The testing of a particular portion of memory 14 can be done sequentially during different periods of time. Furthermore, different events may trigger the testing of a particular portion of memory 14.

Next, operation of snooping circuitry 36 will be described in reference to FIG. 8 and FIGS. 3-6. Snooping circuitry 36 allows for a portion of memory 14 (such as, for example, the portion located at AUT 51 and the corresponding alias addresses 47) to be tested while memory 14 can continue to be accessed by interconnect masters such as processor 12. For example, if a current access address received from processor 12 (as access address 25) matches any address in the portion of memory 14 being tested, snooping circuitry 36 can, in the case of a read access, provide the correct read data to processor 12 from the one of registers 32 or 34 which corresponds to the matching address, or, in the case of a write access, can receive the write data from processor 12 into the one of the registers 32 or 34 which corresponds to the matching address (where this write data will later be restored back to memory 14 by testing control circuitry 30 in block 71 of FIG. 7).

FIG. 8 illustrates a flow 80 which describes operation of snooping circuitry 36 in accordance with one embodiment of the present invention. Note that flow 80 can occur during the testing of memory 14 (such as during flow 60 of FIG. 7 or at least partially simultaneous with flow 60). Flow 80 begins with block 82 where processor 12 generates access address 25 to access memory 14 during data-processing activity execution (such as, for example, software execution) on processor 12 and provides this access address to system interconnect 18. Flow proceeds to block 84 where interface circuitry 22 of memory 14 receives access address 25, and then to block 86 where interface circuitry 22 provides access address 25 to snooping circuitry 36.

Figure 3:
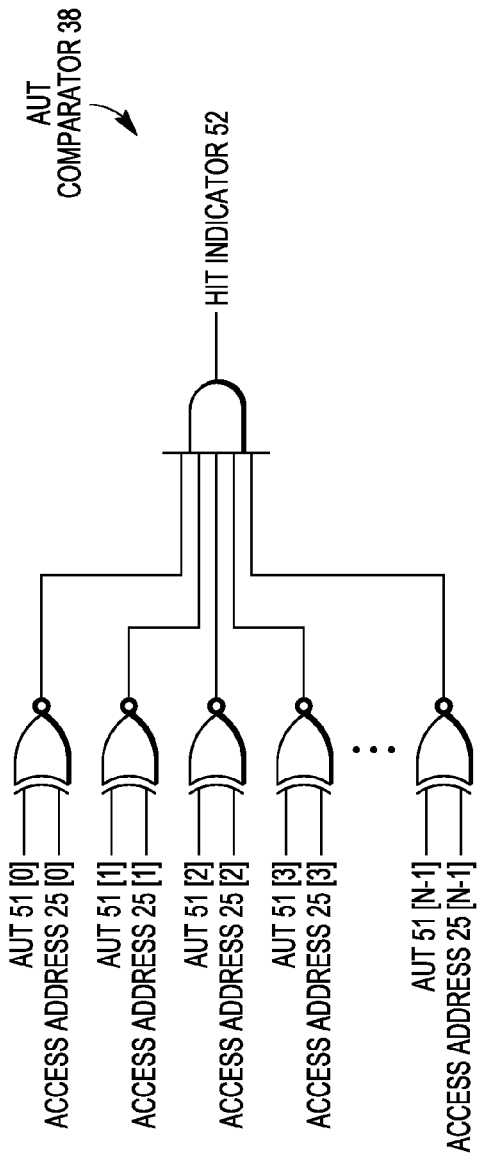
FIG. 3 illustrates, in schematic form, a portion of the AUT comparator of FIG. 2, in accordance with one embodiment of the present invention.

Flow then proceeds to block 88 in which snooping circuitry 36 determines if access address 25 matches AUT 51 and generates hit indicator 54 in response thereto. For example, referring to FIG. 2, AUT comparator 38 receives AUT 51 from testing control circuitry 30 and receives access address 25 via interface circuitry 22 and performs a comparison to determine whether the two address match or not. If they match, then hit indicator 52 is asserted to indicate the match. If not, then hit indicator 52 is negated to indicate that no match occurred (i.e. that a miss occurred). Hit indicator 52 is provided to miss determination circuitry 42. One embodiment of AUT comparator 38 is illustrated in FIG. 3. In one embodiment, a plurality of exclusive NOR (XNOR) gates are used where each XNOR gate receives one bit of AUT 51 and one bit of access address 25. Therefore, in one embodiment, there are N XNOR gates to receive, at one input, bits 0 to N–1 of AUT 51, respectively, and, at a second input, bits 0 to N–1 of access address 25, respectively. The outputs of all the XNOR gates are provided to an N-input AND gate which provides at its output hit indicator 52. Therefore, if all the address bits match, hit indicator 52 will be asserted. However, if one or more of the address bits between AUT 51 and access address 25 do not match, the outputs of one or more of those XNOR gates will be negated and thus hit indicator 52 will be negated. Note that any logic design may be used to implement AUT comparator 38 to generate hit indicator 52.

Referring back to FIG. 8, flow proceeds from block 88 to block 90 in which snooping circuitry 36 determines if access address 25 matches any of the plurality of generated addresses (e.g. alias addresses 47) and generates hit indicators [0:N–1] 54 in response thereto. For example, referring to FIG. 2, alias comparators (0:N–1) receives the plurality of generated addresses (alias addresses 47) from test control circuitry 30 and receives access address 25 via interface circuitry 22 and compares each alias address of generated alias addresses 47 to access address 25 to determine whether any of the alias addresses match access address 25 and provides hit indicators [0:N–1] 54 in response thereto. For each comparison, alias comparators (0:N–1) provides a corresponding one of hit indicators [0:N–1] 54, and all of hit indicators 54 are provided to miss determination circuitry 42. For example, as discussed in the example above, if access address 25 is an N-bit address, testing control circuitry 30 generates N alias addresses (alias addresses 0 through alias address N). If any of the N alias addresses match access address 25 then the corresponding hit indicator of hit indicators [0:N–1] 54 is asserted.

Figure 4:
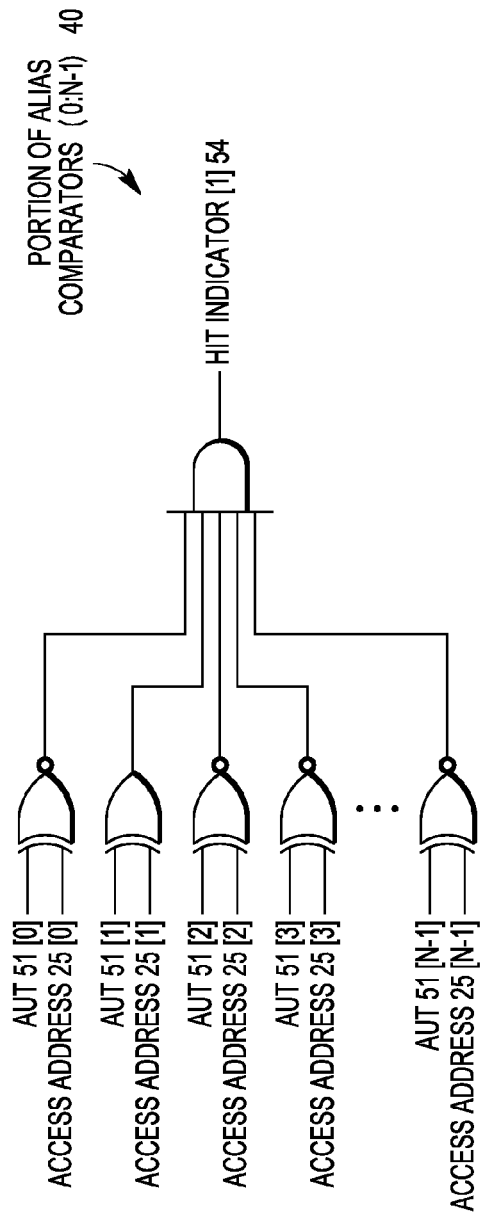

FIGS. 4 and 5 illustrate portions of alias comparators (0:N–1) in accordance with one embodiment of the present invention. FIG. 4 illustrates one example of how hit indicator[1] 54 is generated, and FIG. 5 illustrates one example of how hit indicator[2] 54 is generated. FIG. 4 includes N–1 XNOR gates and one exclusive OR (XOR) gate which receive, at one input, bits 0 to N–1 of AUT 51, respectively, and, at a second input, bits 0 to N–1 of access address 25, respectively. In the case of FIG. 4, the one XOR gate is coupled to receive address bits 1 of the inputs (e.g. AUT 51 [1] and access address 25 [1]). The outputs of all the XNOR gates and the XOR gate are provided to an N-input AND gate which provides at its output hit indicator[1] 54 which indicates whether alias address 1 (whose original contents are saved in alias register 1 of registers 34) matches access address 25. Note that alias address 1, in the current example, corresponds to AUT 51 but with address bit 1 (AUT 51 [1]) being inverted. Therefore, if AUT 51 [0 and 2:N–1] matches access address 25 [0 and 2:N–1] and if AUT 51 [1] is inverted with respect to access address 25 [1], then hit indicator[1] 54 will be asserted. However, if one or more of the address bits, other than bit 1, between alias address 1 and access address 25 do not match, or if address bit 1 does not match in inversion, then the outputs of one or more of those XNOR gates or of the one XOR gate will be negated and thus hit indicator[1] 54 will be negated. FIG. 5 includes N–1 XNOR gates and one XOR gate which receive, at one input, bits 0 to N–1 of alias address 2, respectively, and, at a second input, bits 0 to N–1 of access address 25, respectively. In the case of FIG. 5, the XOR gate is on bit 2, instead of on bit 1, as it is in FIG. 4. Therefore, the XOR gate is coupled to receive address bits 2 of the inputs (e.g. AUT 51 [2] and access address 25 [2]). The outputs of all the XNOR gates and the XOR gate are provided to an N-input AND gate which provides at its output hit indicator[2] 54 which indicates whether alias address 2 (whose original contents are saved in alias register 2 of registers 34) matches access address 25. Note that alias address 2, in the current example, corresponds to AUT 51 but with address bit 2 (AUT 51 [2[ ] being inverted. Therefore, if AUT 51 [0:1 and 3:N–1] matches access address 25 [0:1 and 3:N–1] and if AUT 51 [2] is inverted with respect to access address 25 [2], then hit indicator[2] 54 will be asserted. However, if one or more of the address bits, other than bit 2, between alias address 2 and access address 25 do not match, or if address bit 2 does not match in inversion, then the outputs of one or more of those XNOR gates or of the one XOR gate will be negated and thus hit indicator[2] 54 will be negated.

The same logic design may be used to generate each of hit indicator [0 and 3:N–1]. Note that, in alternate embodiments, any logic design may be used to implement AUT comparator 38 to generate hit indicator 52 and any logic design may be used to implement comparators 40 to generate hit indicators 54. For example, in the embodiment illustrated in FIGS. 4 and 5, AUT 51 is provided as inputs to alias comparator 40, where the XOR gates are used to handle the inversion of a particular bit for the alias addresses, rather than explicitly providing alias address 1 and alias address 2 to alias comparators 40 for the comparison. In this embodiment, note that, referring back to FIG. 2, AUT 51 may be provided from testing control circuitry 30 to alias comparators 40 rather than alias addresses 47. However, in an alternate embodiment, alias comparators 40 could receive each of alias address 0—alias address 1 (as alias addresses 47), and directly compare each alias address to access address 25. In this case, in FIG. 4, only XNOR gates would be used where each XNOR gate would receive, at one input, bits 0 to N–1 of alias address 1 (alias address 1 [0:N–1]), respectively, and at a second input, bits 0 to N−1 of access address 25, respectively. Similarly, in FIG. 5 for this alternate embodiment, only XNOR gates would be used where each XNOR gate would receive, at one input, bits 0 to N−1 of alias address 2 (alias address 2 [0:N−1]), respectively, and at a second input, bits 0 to N−1 of access address 25, respectively. Alternatively, other logic designs may be used to generate hit indicators 54.

Referring back to FIG. 8, flow proceeds from block 90 to 92 in which snooping circuitry 36 generates, based on hit indicator 52 and hit indicators 54, snoop miss indicator 27. In one embodiment, if no hits occurred (if access address 25 did not match AUT 51 nor did it match any of alias addresses 47), then snoop miss indicator 27 is asserted to indicate a miss (to indicate that a match did not occur). However, if a hit occurred (if access address 25 did match AUT 51 or if it matched any of alias addresses 47), then snoop miss indicator 27 is negated to indicate that a hit occurred (that a match did occur). Therefore, miss determination circuitry 42 receives hit indicator 52 and hit indicators 54 and generates snoop miss indicator 27 accordingly and may provide this indicator to interface circuitry 22 of memory 14. FIG. 6 illustrates one embodiment of miss determination circuitry 42 which includes an N+1 input NOR gate which receives each of hit indicator 52 and hit indicators [0:N−1] 54. If any of these inputs is asserted, then snoop miss indicator 27 is negated to indicate a match occurred. However, if all these inputs are negated, then snoop miss indicator 27 is asserted to indicate no match occurred. Alternate embodiments may use any logic design to implement miss determination circuitry 42. For example, the miss indicator does not necessarily need to be generated from the hit indicators.

Referring back to FIG. 8, flow proceeds from block 92 to decision diamond 94 where it is determined whether snoop miss indicator 27 indicates a miss or not. If so, then flow proceeds to block 96 where memory 14 is accessed in response to access address 25. That is, if snoop miss indicator 27 indicates a miss, no match occurred, and access address 25 corresponds to an address location of memory 14 that is not currently being tested, thus memory 14 can provide the read data or receive the write data. However, if snoop miss indicator 27 does not indicate a miss, flow proceeds from decision diamond 94 to block 98 where the contents of register 32 or one of registers 34 corresponding to hit indicators 52 and 54 is used to provide the read data or receive the write data corresponding to access address 25. If access address 25 is a write access address (as indicated by R/W indicator 29) snooped data 23 (which is the write data provided with the write access request from processor 12) is stored into the selected register of AUT register 32 and registers 34 corresponding to the asserted hit indicator of hit indicators 52 and 54. If access address 25 is a read access address (as indicated by R/W indicator 29), snooped data 23 is provided from the selected register to processor 12 as the read data in response to the read access request. The selected register is selected based on which of AUT 51 or alias addresses 47 matched access address 25 (i.e. which address resulted in a hit). Therefore, referring back to FIG. 2, snooped data selector 44, in response to a snoop hit, is able to appropriately route data from register 32 or registers 34 as snooped data 23 back to processor 12 via interconnect circuitry 22 in the case of a read access or route snooped data 23 to the appropriate register of register 32 or registers 34 in the case of a write access. In one embodiment, snooped data selector 44, in response to snoop miss indicator 27 being negated (thus indicating a snoop hit), uses hit indicator 52 and hit indicators 54 to determine which of register 32 or registers 34 corresponds to the snoop hit. For example, if hit indicator 52 is asserted because access address 25 matched AUT 51, then AUT register 32 corresponds to the hit and snooped data 23 is routed to AUT register 32 if R/W indicator 29 indicates a write or the contents of AUT register 32 is provided by snooped data selector 44 as snooped data 23 if R/W indicator 29 indicates a read. If, for example, one of hit indicators (0:N−1) is asserted, then the corresponding one of alias registers (0:N−1) corresponds to the hit and snooped data 23 is routed to the corresponding one of alias registers (0:N−1) if R/W indicator 29 indicates a write or the contents of the corresponding one of alias registers (0:N−1) is provided by snooped data selector 44 as snooped data 23 if R/W indicator 29 indicates a write.

Note that flow 80 of FIG. 8 can be occurring within system 10 simultaneously with flow 60 of FIG. 7. That is, even while testing control circuitry 30 is directing the testing of particular memory locations in memory 14 (or of any other memory in system 10), processor 12 (or any other interconnect master) can continue to generate access addresses which are capable of addressing the same particular memory locations which are being currently tested. Note also that AUT comparator 38, alias comparators 40, and miss determination circuitry 42 can be combined into a logic block which outputs snoop miss indicator 27 which indicates a miss when access address 25 does not match the AUT nor any of the alias addresses. For example, in one embodiment, hit indicator 52 or hit indicators 54 may not be explicitly generated. Also, snoop miss indicator can be implemented as a snoop hit indicator, or it may be referred to as a snoop hit/miss indicator.

By now it should be appreciated that snooping circuitry 36 allows for the use of memory 14 even while being tested. That is, if processor 12 or some other interconnect master such as a DMA generates an access request to a particular memory location in memory 14 that is being tested, snooping circuitry 36 is able to respond to that access request from register 32 or one of registers 34. If the access request is for a memory location in memory 14 that is not being currently tested, then memory 14 is able to respond to the access request. Therefore, through the use of register 32, registers 34, and snooping circuitry 36, memory 14 can be tested with minimal intrusiveness to operations requiring access to the portions being tested. Furthermore, note that snooping circuitry such as snooping circuitry 36 may be used for any number of memories within system 10 and is not limited to use with a single memory.

In one embodiment, memory 14 may simultaneously respond to an access address (rather than waiting to respond until snoop miss indicator 27 actually indicates a miss), where snoop miss indicator 27 may be used by interface circuitry 22 to determine if the response is correct or not. For example, in the case of a read access, if snoop miss indicator 27 indicates a snoop hit, then interface circuitry 22 knows that memory 14 is providing corrupted data in response to the read data (since that memory location is being tested) and knows that snooped data 23 is the correct read data. In the case of a write access, if snoop miss indicator 27 indicates a snoop hit, then interface circuitry 22 knows it cannot write the write data to the memory because it may get corrupted by memory testing and thus knows the write data should be provided as snooped data 23 to the appropriate register of registers 32 or 34.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIGS. 1 and 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 14 may be located on a same integrated circuit as processor 12 or on a separate integrated circuit or located within another peripheral or slave discretely separate from other elements of system 10. Other modules 20 may also be located on separate integrated circuits or devices.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of testing a memory including generating a first address as an address under test (AUT); accessing contents of the AUT in the memory and storing the contents into an address under test (AUT) register; generating a plurality of addresses corresponding to a portion of the memory; accessing contents of each of the plurality of addresses in memory and storing the contents into a plurality of registers; performing a memory test in the memory on the AUT and the plurality of addresses; generating an access address within an interconnect master; receiving the access address within snooping circuitry of memory test circuitry; determining if the access address matches the AUT and generating a first hit indicator in response thereto; determining if the access address matches at least one of the plurality of addresses and generating a plurality of hit indicators in response thereto; generating within snooping circuitry a snoop miss indicator; determining if the snoop miss indicator indicates a miss because the access address does not match at least one of the AUT and the plurality of addresses; if the snoop miss indicator indicates a miss, accessing the memory in response to the access address; and if the snoop miss indicator does not indicate a miss, either storing snooped data from the interconnect master to a selected register of the group consisting of the AUT register and the plurality of registers, wherein the selected register is determined based on at least one of the first hit indicator and the plurality of hit indicators, or reading the snooped data from the selected register of the group consisting of the AUT register and the plurality of registers to the interconnect master. Item 2 includes the method of item 1 wherein the plurality of addresses are aliases of the AUT and the plurality of registers are alias registers. Item 3 includes the method of item 1 and further includes writing contents of the AUT register and the plurality of registers to the memory after performing the memory test. Item 4 includes the method of item 1, wherein the receiving the access address within the snooping circuitry, the determining if the access address matches the AUT, the determining if the access address matches at least one of the plurality of addresses, the generating within the snooping circuitry the snoop miss indicator, the accessing the memory if the snoop miss indicator indicates a miss, and the either storing the snoop data to a selected register or the reading the snooped data from the selected register if the snoop miss indicator does not indicate a miss are all performed during the performing the memory test in the memory on the AUT and the plurality of addresses. Item 5 includes the method of item 1, wherein the accessing the contents of the AUT in the memory comprises reading contents of the AUT in the memory and wherein the accessing the contents of each of the plurality of addresses in the memory comprises reading contents of each of the plurality of addresses in memory. Item 6 includes the method of item 1, wherein the generating an access address occurs to access the memory during software execution on the interconnect master. Item 7 includes the method of item 1, wherein the receiving the access address within the snooping circuitry includes receiving the access address within interface circuitry of the memory from the interconnect master through a system interconnect, wherein the interconnect master is a processor; and providing the access address from the interface circuitry to the snooping circuitry. Item 8 includes the method of item 1, and further includes generating a next address as the AUT in response to determining if additional addresses in the memory are to be tested. Item 9 includes the method of item 1, and further includes generating the snoop miss indicator is based on the first hit indicator and the plurality of hit indicators.

Item 10 includes a method of testing a memory, where the method includes generating a plurality of addresses corresponding to a portion of the memory; reading contents of each of the plurality of addresses in the memory and storing the contents of each of the plurality of addresses into storage circuitry; and performing a memory test on the plurality of addresses. During the performing the memory test on the plurality of addresses, the method further includes accessing memory test circuitry by sending an access address to snooping circuitry within the memory test circuitry, wherein the access address is generated by an interconnect master and corresponds to an address location in the memory; determining if the access address matches at least one of the plurality of addresses and generating a snoop miss indicator in response thereto, wherein the snoop miss indicator indicates a miss when the access address does not match at least one of the plurality of addresses; if the snoop miss indicator indicates a miss, accessing the memory in response to the access address; and if the snoop miss indicator does not indicate a miss, either storing write data from the interconnect master to a selected portion of the storage circuitry when the access address corresponds to a write access or providing read data from the selected portion of the storage circuitry to the interconnect master, and wherein the selected portion of the storage circuitry is selected based on which of the plurality of addresses matched the access address. Item 11 includes the method of item 10, wherein the plurality of addresses comprises an address under test (AUT) and at least one address that is an alias of the AUT. Item 12 includes the method of item 11, wherein the storage circuitry comprises an address under test (AUT) register and at least one alias register. Item 13 includes the method of item 12, and further includes writing contents of the storage circuitry to the memory after the performing the memory test. Item 14 include the method of item 10, wherein the access address is generated by the interconnect master during software execution on the interconnect master. Item 15 includes the method of item 10, wherein the generating the snoop miss indicator is based on at least one hit indicator.

Item 16 includes an apparatus including storage circuitry for storing contents of an address under test (AUT) and contents of a portion of a memory; and snooping circuitry. The snooping circuitry includes a plurality of comparators for receiving an access address from an interconnect master, wherein the access address corresponds to an address location in the memory, determining if the access address matches at least one of the group consisting of the AUT and addresses of the portion of the memory whose contents are stored in the storage circuitry, and generating at least one hit indicator in response thereto; miss determination circuitry for generating a snoop miss indicator which indicates a miss when the access address does not match at least one of the AUT and the addresses of the portion of the memory whose contents are stored in the storage circuitry; and snooped data selector for either storing data from the interconnect master to a selected portion of the storage circuitry based on the at least one hit indicator or providing data from the selected portion of the storage circuitry to the interconnect master, when the snoop miss indicator does not indicate a miss. Item 17 includes the apparatus of item 16, wherein the addresses of the portion of the memory are aliases of the AUT and the storage circuitry comprises an address under test (AUT) register for storing the contents of the AUT and at least one alias register for storing the contents of the portion of the memory. Item 18 includes the apparatus of item 17, wherein the plurality of comparators comprises an AUT comparator for determining if the access address matches the AUT, and at least one alias comparator for determining if the access address matches any of the aliases of the AUT. Item 19 includes the apparatus of claim 17 and further includes testing control circuitry for receiving the AUT, storing the contents of the AUT in the AUT register, performing a memory test on the memory location in the memory corresponding to the AUT and on the portion of the memory, and, after performing the test, writing contents of the storage circuitry to the memory. Item 19 includes the apparatus of item 19, wherein the plurality of comparators receives the access address from the interconnect master, the miss determination circuitry generates the snoop miss indicator, and data is either stored to the selected portion of the storage circuitry or provided from the selected portion of the storage circuitry occurs at least partially simultaneously with the testing control circuitry performing the memory test.

What is claimed is:
1. A method of testing a memory, the method comprising:
generating a first address as an address under test (AUT);
accessing contents of the AUT in the memory and storing the contents into an address under test (AUT) register;
generating a plurality of addresses corresponding to a portion of the memory;
accessing contents of each of the plurality of addresses in the memory and storing the contents into a plurality of registers;
performing a memory test in the memory on the AUT and the plurality of addresses;

generating an access address within an interconnect master;
receiving the access address within snooping circuitry of memory test circuitry;
determining if the access address matches the AUT and generating a first hit indicator in response to the determining if the access address matches the AUT;
determining if the access address matches at least one of the plurality of addresses and generating a plurality of hit indicators in response to the determining if the access address matches at least one of the plurality of addresses;
generating within snooping circuitry a snoop miss indicator;
determining if the snoop miss indicator indicates a miss because the access address does not match at least one of the AUT and the plurality of addresses;
if the snoop miss indicator indicates a miss, accessing the memory in response to the access address; and
if the snoop miss indicator does not indicate a miss, either storing snooped data from the interconnect master to a selected register of the group consisting of the AUT register and the plurality of registers, wherein the selected register is determined based on at least one of the first hit indicator and the plurality of hit indicators, or reading the snooped data from the selected register of the group consisting of the AUT register and the plurality of registers to the interconnect master,
wherein the plurality of addresses are aliases of the AUT and the plurality of registers are alias registers.

2. The method of claim 1, further comprising writing contents of the AUT register and the plurality of registers to the memory after performing the memory test.

3. The method of claim 1, wherein the receiving the access address within the snooping circuitry, the determining if the access address matches the AUT, the determining if the access address matches at least one of the plurality of addresses, the generating within the snooping circuitry the snoop miss indicator, the accessing the memory if the snoop miss indicator indicates a miss, and the either storing the snoop data to a selected register or the reading the snooped data from the selected register if the snoop miss indicator does not indicate a miss are all performed during the performing the memory test in the memory on the AUT and the plurality of addresses.

4. The method of claim 1, wherein the accessing the contents of the AUT in the memory comprises reading contents of the AUT in the memory and wherein the accessing the contents of each of the plurality of addresses in the memory comprises reading contents of each of the plurality of addresses in the memory.

5. The method of claim 1, wherein the generating an access address occurs to access the memory during software execution on the interconnect master.

6. The method of claim 1, wherein the receiving the access address within the snooping circuitry comprises:
receiving the access address within interface circuitry of the memory from the interconnect master through a system interconnect, wherein the interconnect master is a processor; and
providing the access address from the interface circuitry to the snooping circuitry.

7. The method of claim 1, further comprising generating a next address as the AUT in response to determining if additional addresses in the memory are to be tested.

8. The method of claim 1, wherein generating the snoop miss indicator is based on the first hit indicator and the plurality of hit indicators.

9. A method of testing a memory, the method comprising:
generating a plurality of addresses corresponding to a portion of the memory, wherein the plurality of addresses comprises an address under test (AUT) and at least one address that is an alias of the AUT;
reading contents of each of the plurality of addresses in the memory and storing the contents of each of the plurality of addresses into storage circuitry;
performing a memory test on the plurality of addresses, wherein during the performing the memory test on the plurality of addresses, the method further comprises:
accessing memory test circuitry by sending an access address to snooping circuitry within the memory test circuitry, wherein the access address is generated by an interconnect master and corresponds to an address location in the memory;
determining if the access address matches at least one of the plurality of addresses and generating a snoop miss indicator in response thereto, wherein the snoop miss indicator indicates a miss when the access address does not match at least one of the plurality of addresses;
if the snoop miss indicator indicates a miss, accessing the memory in response to the access address; and
if the snoop miss indicator does not indicate a miss, either storing write data from the interconnect master to a selected portion of the storage circuitry when the access address corresponds to a write access or providing read data from the selected portion of the storage circuitry to the interconnect master, and wherein the selected portion of the storage circuitry is selected based on which of the plurality of addresses matched the access address.

10. The method of claim 9, wherein the storage circuitry comprises an address under test (AUT) register and at least one alias register.

11. The method of claim 10, further comprising writing contents of the storage circuitry to the memory after the performing the memory test.

12. The method of claim 9, wherein the access address is generated by the interconnect master during software execution on the interconnect master.

13. The method of claim 9, wherein the generating the snoop miss indicator is based on at least one hit indicator.

14. An apparatus comprising:
storage circuitry for storing contents of an address under test (AUT) and contents of a portion of a memory;
snooping circuitry comprising:
a plurality of comparators for receiving an access address from an interconnect master, wherein the access address corresponds to an address location in the memory, determining if the access address matches at least one of the group consisting of the AUT and addresses of the portion of the memory whose contents are stored in the storage circuitry, and generating at least one hit indicator in response to the determining if the access address matches at least one of the group consisting of the AUT and addresses of the portion of the memory whose contents are stored in the storage circuitry;
miss determination circuitry for generating a snoop miss indicator which indicates a miss when the access address does not match at least one of the AUT and the addresses of the portion of the memory whose contents are stored in the storage circuitry; and
snooped data selector for either storing data from the interconnect master to a selected portion of the storage circuitry based on the at least one hit indicator or providing data from the selected portion of the storage circuitry to the interconnect master, when the snoop miss indicator does not indicate a miss, wherein the addresses of the portion of the memory are aliases of the AUT and the storage circuitry comprises an address under test (AUT) register for storing the contents of the AUT and at least one alias register for storing the contents of the portion of the memory.

15. The apparatus of claim 14, wherein the plurality of comparators comprises an AUT comparator for determining if the access address matches the AUT, and at least one alias comparator for determining if the access address matches any of the aliases of the AUT.

16. The apparatus of claim 14, further comprising testing control circuitry for receiving a first address corresponding to the AUT, storing the contents of the AUT in the AUT register, performing a memory test on the memory location in the memory corresponding to the AUT and on the portion of the memory, and, after performing the memory test, writing contents of the storage circuitry to the memory.

17. The apparatus of claim 16, wherein the plurality of comparators receiving the access address from the interconnect master, the miss determination circuitry generating the snoop miss indicator, and data being either stored to the selected portion of the storage circuitry or provided from the selected portion of the storage circuitry occur at least partially simultaneously with the testing control circuitry performing the memory test.

* * * * *